(12) United States Patent
Kagawa

(10) Patent No.: US 6,858,845 B2
(45) Date of Patent: Feb. 22, 2005

(54) SCANNING ELECTRON MICROSCOPE

(75) Inventor: Toru Kagawa, Akishima (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/801,874

(22) Filed: Mar. 16, 2004

(65) Prior Publication Data
US 2004/0183014 A1 Sep. 23, 2004

(30) Foreign Application Priority Data
Mar. 19, 2003 (JP) ........................................ 2003-074740

(51) Int. Cl.$^7$ ......................... H01J 37/28; G01N 23/00; G21K 7/00
(52) U.S. Cl. ....................... 250/310; 250/306; 250/307; 250/311; 250/492.3
(58) Field of Search ......................... 250/306.306, 310, 250/311, 492.3

(56) References Cited

U.S. PATENT DOCUMENTS 5,504,340 A  *  4/1996  Mizumura et al. ...... 250/492.21
2004/0183014 A1  *  9/2004  Kagawa ...................... 250/310

* cited by examiner

Primary Examiner—John R. Lee
Assistant Examiner—Bernard E. Souw
(74) Attorney, Agent, or Firm—Webb Ziesenheim Logsdon Orkin & Hanson, P.C.

(57) ABSTRACT

A scanning electron microscope has an electron gun for producing an electron beam, a specimen holder holding the specimen, an objective lens for sharply focusing the beam onto the specimen, and a power supply for applying a negative voltage to the specimen. A shielding plate made of a conductive material and having at least one hole for limiting the region of the specimen surface illuminated by the beam is mounted on the holder. A voltage almost equal to the voltage applied to the specimen is applied to the shielding plate.

5 Claims, 2 Drawing Sheets

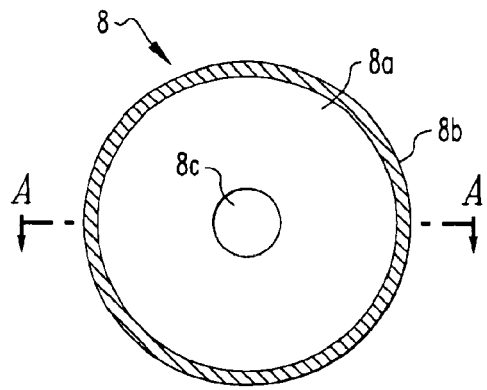
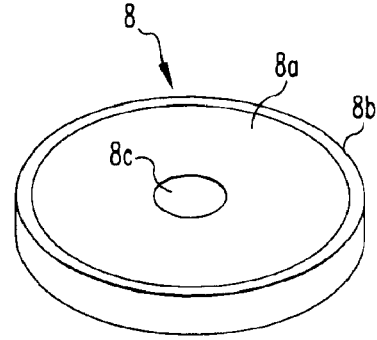
FIG.2A  FIG.2B
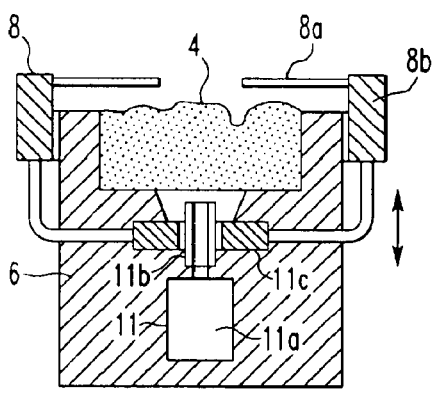
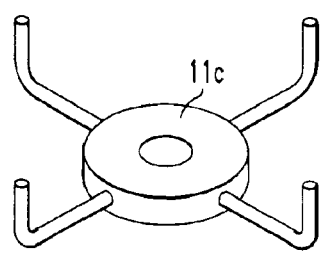
FIG.3A  FIG.3B
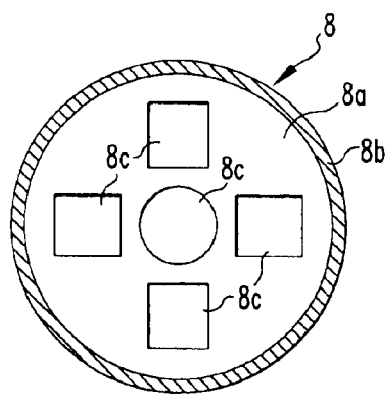
FIG.4

SCANNING ELECTRON MICROSCOPE

BACKGROUND OF THE INVENTION

1. Field of the Invention

The present invention relates to a scanning electron microscope and, more particularly, to a scanning electron microscope capable of producing high-resolution, distortion-free images when a retarding method in which a negative voltage is applied to the specimen is utilized, even if the surface of the specimen contains tilted (inclined) portions or discontinuous steps.

2. Description of Related Art

In scanning electron microscopy, specimens are imaged using an electron beam accelerated by low voltages to avoid specimen charging and damage. At this time, aberration in the objective lens tends to deteriorate as the energy of the electron beam passed through the lens decreases. To avoid this, one method has been put into practical use. In particular, this method consists of causing an electron beam having increased energy to pass through the objective lens area and applying a negative potential to the specimen to thereby decelerate the electron beam that is about to enter the specimen. This method is known as the retarding method and permits high-resolution imaging of the specimen. In this case, secondary electrons produced from the specimen are captured by the magnetic field set up by the objective lens, then pass through the inner polepiece of the objective lens, and finally travel upwardly from the lens. Therefore, the secondary electrons are detected inside or above the objective lens. In this retarding method, an electric field that decelerates the primary electron beam from the electron gun is produced between the specimen and objective lens. Where the surface of the specimen is almost flat and is not tilted (inclined relative to a plane perpendicular to the optical axis of the beam), the electric field between the specimen and objective lens maintains an axisymmetry with respect to the optical axis of the beam. Consequently, no astigmatism (off-axis astigmatism) is given to the primary electron beam.

Where the specimen surface is tilted, the axisymmetry of the electric field between the specimen and objective lens with respect to the optical axis of the electron beam is broken. A lateral electric field component is produced on the optical axis. As a result, the off-axis astigmatism in the electron beam increases and impairs the resolution. A countermeasure against this problem is disclosed, for example, in Japanese Patent Application No. 2002-189936, entitled "Scanning Electron Microscope", where a scanning electron microscope having a cylindrical shield electrode mounted in the electron beam path between the objective lens and specimen is proposed. The shield electrode and specimen are placed at nearly the same potential.

In the retarding method described above, however, where the specimen surface has portions tilted at more than a given angle or discontinuous steps, the axisymmetry of the electric field between each of such tilted portions and discontinuous steps and the objective lens with respect to the optical axis of the electron beam is broken. This induces a lateral electric field component on the optical axis, increasing the off-axis astigmatism. As a result, the circular, sharply focused electron beam assumes a cross section of an elongated ellipse, deteriorating the resolution. Furthermore, the electron beam scanning linearly over the specimen undergoes deflection distortion, thus distorting the image.

SUMMARY OF THE INVENTION

It is an object of the present invention to provide a scanning electron microscope which maintains the symmetry of the electric field with respect to the optical axis of the electron beam under the specimen conditions as described above, suppresses generation of off-axis astigmatism in the beam, and can suppress deflection distortion during scanning of the beam.

A scanning electron microscope according to the present invention achieves this object and has an electron gun for producing an electron beam, an objective lens for sharply focusing the beam onto a specimen, a specimen holder for holding the specimen, and a power supply for applying a negative voltage to the specimen. A conductive plate having a hole permitting passage of the beam is mounted on the specimen holder and disposed to provide a cover over the specimen. A voltage almost equal to the voltage applied to the specimen is applied to the conductive plate.

Other objects and features of the invention will appear in the course of the description thereof, which follows.

BRIEF DESCRIPTION OF THE DRAWINGS

FIG. 2A is a plan view showing the structure of a specimen cap;

FIG. 2B is a perspective view of the specimen cap shown in FIG. 2A;

FIG. 3A is a cross-sectional view taken on line A—A of FIG. 2A, showing a specimen holder and a moving mechanism;

FIG. 3B is a perspective view of a moving arm forming the moving mechanism shown in FIG. 3A; and FIG. 4 is a plan view showing the structure of a specimen cap provided with plural observation holes.

DESCRIPTION OF THE PREFERRED EMBODIMENT

Figure 1:
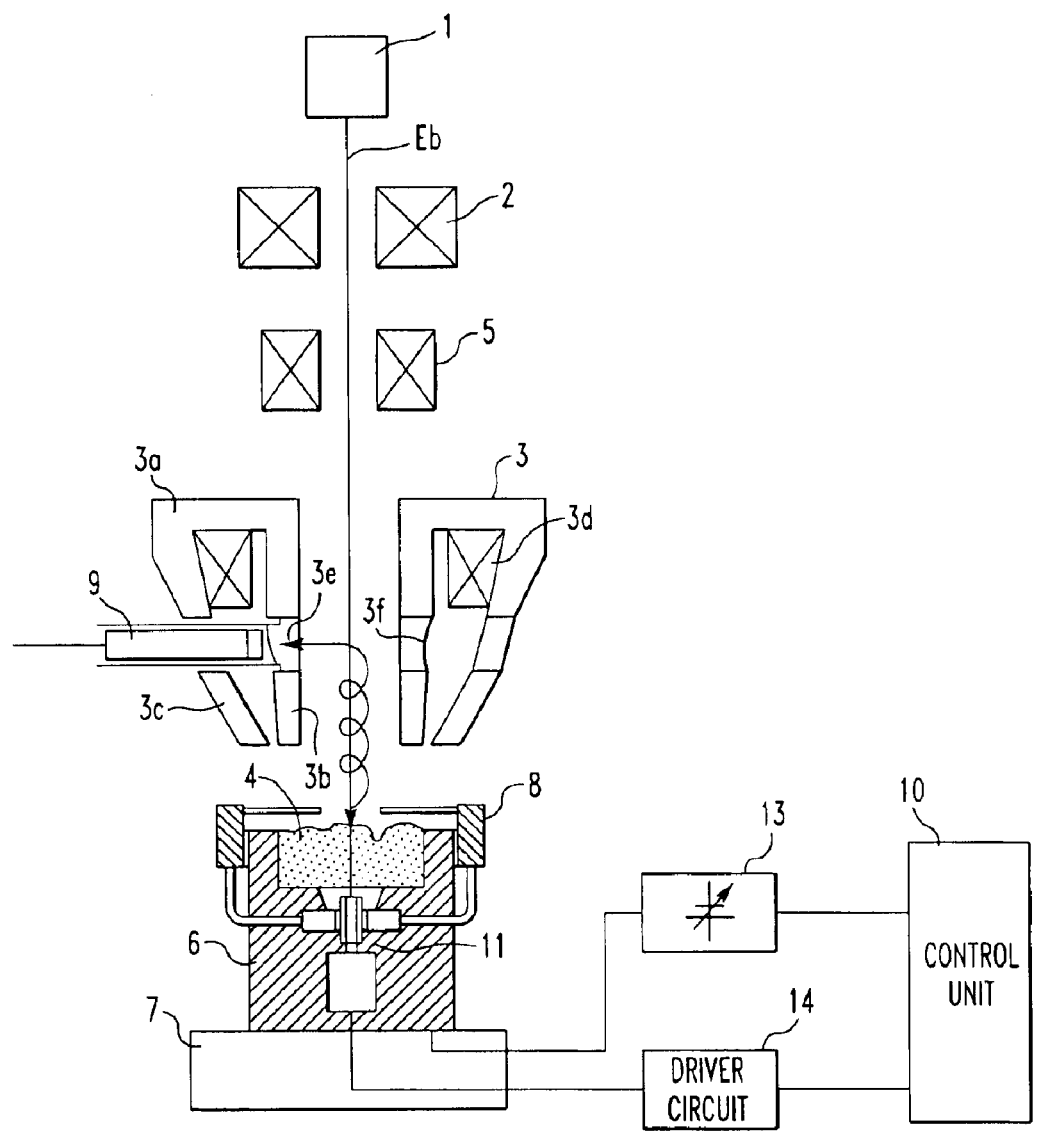
FIG. 1 is a schematic block diagram of a scanning electron microscope according to one embodiment of the present invention.

An embodiment of the present invention is hereinafter described in detail with reference to the accompanying drawings. FIG. 1 shows a scanning electron microscope according to one embodiment of the present invention. The microscope has an electron gun 1 producing a primary electron beam Eb that is sharply focused onto a specimen 4 by condenser lenses 2 and a semi-in objective lens 3, the specimen 4 being held on a specimen holder 6. The beam Eb is deflected by scan coils 5 and scanned in two dimensions over the specimen 4. This scanning electron microscope is under control of a control unit 10 consisting of a computer, such as a personal computer, the computer having input devices, such as a keyboard and a mouse (none of which are shown), and a display device, such as a CRT.

A specimen stage 7 on which the specimen 4 and specimen holder 6 are held is fitted with a horizontal moving mechanism for producing motion in the X- and Y-directions within the plane vertical to the optical axis of the primary electron beam Eb, a vertical moving mechanism for producing motion in the Z-direction (in the direction of the optical axis), and a tilting mechanism. The stage 7 is controlled by the control unit 10 via a stage driver circuit (not shown). A power supply 13 is connected with the specimen holder 6 (and thus specimen 4) via the specimen stage 7. This power supply 13 is used to apply a negative voltage to the specimen 4 so that the beam Eb is decelerated.

The objective lens 3 is composed of an inner polepiece 3b disposed to surround the electron beam path, an outer polepiece 3c disposed to surround the outer periphery of the inner polepiece, a yoke 3a connecting the polepieces 3b and 3c, and exciting coils 3d. Two symmetrically arranged holes 3e and 3f are formed around the center of the objective lens 3 and extend through the polepieces 3a and 3b from outside of the objective lens 3 toward the optical axis of the beam Eb. A secondary electron detector 9 is inserted in one hole 3e. Secondary electrons produced from the specimen 4 and moving upward through the objective lens 3 are guided into the hole 3e and hit the secondary electron detector 9, where the electrons are detected.

The secondary electron detector 9 consists of a combination of a scintillator and a photomultiplier (none of which are shown). An annular electrode is mounted around the circular scintillator mounted at the front end. A positive voltage of about +10 kV is applied to the electrode to attract the secondary electrons. The output signal from the secondary electron detector 9 is amplified by an amplifier (not shown) and supplied to the display device. Thus, a secondary electron image of the specimen is displayed on the viewing screen of the display device.

A specimen cap 8 according to the present invention covers the top of the specimen holder 6 and specimen 4 and holds it. As shown in FIGS. 2A and 2B, the specimen cap 8 is composed of a circular, flat shielding plate 8a and a ring 8b arranged along the outer periphery of the shielding plate 8a. The shielding plate 8a and ring 8b are made of a conductive material. A round hole acting as an observation hole 8c is formed in the shielding plate 8a. The same negative voltage as applied to the specimen 4 via the specimen holder 6 is applied to the specimen cap 8.

A moving mechanism 11 holds the specimen cap 8 on the specimen holder 6 and is used to move the specimen cap 8. The structure of the moving mechanism 11 is shown in FIG. 3A, which is a cross-sectional view taken on line A—A of FIG. 2A, showing the specimen holder 6 and moving mechanism 11. The moving mechanism 11 is mounted within the specimen holder 6 and has the function of moving the specimen cap 8 up and down along the optical axis of the electron beam Eb to adjust the distance between the surface of the specimen 4 and the shielding plate 8a appropriately. A motor 11a has a shaft to which a screw 11b is mounted. In the specimen cap 8, a moving arm portion 11c (see FIG. 3B) of the moving mechanism 11 is moved up or down in the direction of the arrow, depending on the direction of rotation of the screw 11b. This moving mechanism 11 is driven under control of the control unit 10 via a moving driver circuit 14 (see FIG. 1).

The specimen 4 contains a large tilted portion having a tilt exceeding a given value and a discontinuous step having a height exceeding a certain value as shown in FIG. 1. Where secondary electron imaging of the specimen 4 is carried out, a scanning signal is supplied to the scan coils 5 from a scanning signal generator circuit (not shown). The region that is located over the specimen 4 and just under the objective lens 3 is raster-scanned by the electron beam Eb. The accelerating voltage of the beam Eb is set to a high value (e.g., 4 kV). The beam Eb passes through the objective lens 3 with relatively high energies and so aberration that the beam Eb undergoes from the objective lens 3 is reduced. A negative voltage of −3 kV, for example, is applied to the specimen 4 by the power supply 13. Therefore, the beam Eb is decelerated immediately ahead of the specimen 4 and hits the specimen 4 with energies of about 1 keV.

In the case of the prior art technique not having the specimen cap 8 that covers the top of the specimen 4, the axisymmetry of the electric field produced between each of the tilted portion and discontinuous portion of the specimen 4 and the objective lens 3 with respect to the optical axis of the electron beam Eb is broken. A lateral electric field component is produced on the optical axis. This increases off-axis astigmatism and deteriorates the resolution. The beam Eb scanning over the specimen 4 undergoes deflection distortion. In consequence, the image is distorted.

In the present invention, to remove this drawback, the top of the specimen 4 and specimen holder 6 are covered by the specimen cap 8. The electron beam Eb is directed at the specimen 4 through the observation hole 8c formed in the shielding plate 8a to permit passage of the beam. Since the shielding plate 8a is flat and applied with the same voltage as applied to the specimen 4, an unwanted electric field at the axisymmetric plane between the specimen 4 and shielding plate 8a is suppressed. Also, the axisymmetry of the electric field between the shielding plate 8a and objective lens 3 is not impaired. As a result, the electron beam Eb passed through the objective lens 3 maintains the axisymmetry with respect to the optical axis throughout its way to the specimen surface. Accordingly, no lateral electric field component is produced on the optical axis of the beam Eb. Hence, generation of astigmastism leading to a deterioration of the resolution is suppressed on the tilted portion and on the discontinuous step of the specimen 4. The beam Eb hits the specimen 4 while the deflection distortion that would normally distort the image is suppressed. Consequently, even if the surface of the specimen 4 contains a tilted surface portion or discontinous step, a high-resolution, distortion-free secondary electron image can be obtained.

The position of the specimen cap 8 may be adjusted between the specimen 4 and the shielding plate 8a of the cap 8 according to the magnitude of the tilt angle of the tilted portion of the specimen or the height of the discontinous step of the specimen 4. Where the tilt angle of the tilted surface portion of the specimen 4 or height of the step is larger, the adjustment is made in the direction to increase the distance between the specimen 4 and the shielding plate 8a of the cap 8. Conversely, where the tilt angle of the tilted surface portion of the specimen 4 or height of the step is smaller, the adjustment is made in the direction to reduce the distance between the specimen 4 and the shielding plate 8a of the cap 8. This maintains the axisymmetry of the electric field with respect to the optical axis of the beam Eb and, thus, no lateral electric field component is produced on the optical axis.

We have conducted experiments using various sizes of the observation hole 8c and found that conspicuous advantages can be obtained where the diameter is less than 6 mm.

While an embodiment of the present invention has been described so far, the invention is not limited to this embodiment. For example, the objective lens is not limited to the semi-in lens type. The invention can be applied to any scanning electron microscope in which an electric field is produced between the objective lens 3 and specimen 4, and has an axisymmetry with respect to the optical axis and the lack of axisymmetry adversely affecting the primary electron beam Eb. The secondary electron detector is positioned within the objective lens in the above embodiment. The detector may also be disposed above the objective lens 3. The specimen cap 8 may be provided with plural observation holes 8c according to the purpose. In this case, the specimen holder 6 may be moved and the observation hole 8c may be selected for use. The observation holes 8c are not limited to circular form. They may also be polygonal, such as square (see FIG. 4).

As is apparent from the description provided so far, the specimen cap 8 is mounted at a given distance above the specimen 4. The same voltage as applied to the specimen 4 is applied to the specimen cap 8. Consequently, the symmetry of the electric field with respect to the optical axis of the electron beam Eb can be maintained even if the surface of the specimen 4 has a tilted portion or discontinuous step. This suppresses generation of astigmatism in the beam Eb. As a result, a high-resolution, distortion-free secondary electron image can be obtained. Furthermore, by controlling the given distance optimally according to the tilt angle of the tilted portion or the height of the discontinous step on the specimen 4, the specimen cap 8 can further improve the astigmatism in the beam Eb.

Having thus described my invention with the detail and particularity required by the Patent Laws, what is desired protected by Letters Patent is set forth in the following claims.

The invention claimed is:

1. A scanning electron microscope comprising:
    an electron gun for producing an electron beam;
    an objective lens for sharply focusing the beam onto a specimen;
    a specimen holder for holding the specimen;
    a power supply for applying a negative voltage to the specimen; and
    a conductive plate having at least one hole permitting passage of the beam, the conductive plate being disposed to provide a cover over the specimen, the conductive plate being mounted on said specimen holder,
    wherein a voltage substantially equal to the voltage applied to the specimen is applied to said conductive plate.

2. The scanning electron microscope of claim 1, wherein said conductive plate is held to said specimen holder such that the distance between the conductive plate and a surface of said specimen can be adjusted.

3. The scanning electron microscope of claim 1, wherein plural holes for permitting passage of the beam are formed in said conductive plate.

4. The scanning electron microscope of claim 1, wherein the voltage applied to the specimen and the conductive plates is selected to reduce specimen charging and damaging.

5. The scanning electron microscope of claim 1, wherein the electron gun provides the electron beam with energy sufficient to minimize aberration in the objective lens.

* * * * *